(12) United States Patent
Watanabe et al.

(10) Patent No.: US 6,657,366 B2
(45) Date of Patent: Dec. 2, 2003

(54) SURFACE ACOUSTIC WAVE ELEMENT

(75) Inventors: Masanobu Watanabe, Kanazawa (JP); Kazuhiro Inoue, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/957,895

(22) Filed: Sep. 22, 2001

(65) Prior Publication Data

US 2002/0074904 A1 Jun. 20, 2002

(30) Foreign Application Priority Data

Oct. 26, 2000 (JP) ........................................ 2000-327304

(51) Int. Cl.[7] .............................................. H01L 41/08
(52) U.S. Cl. ..................................... 310/364; 310/313 A
(58) Field of Search .............................. 310/364, 313 R, 310/313 B, 313 C, 313 A

(56) References Cited

U.S. PATENT DOCUMENTS 5,773,917 A * 6/1998 Satoh et al. ................. 310/364
5,844,347 A * 12/1998 Takayama et al. ......... 310/313 R
5,909,156 A * 6/1999 Nishihara et al. ............ 333/193
6,259,185 B1 * 7/2001 Lai ............................. 310/364

FOREIGN PATENT DOCUMENTS

| JP | 7-122961 | 5/1995 |
| JP | 9-69748 | 3/1997 |
| JP | 9-223944 A | 8/1997 |
| WO | WO99/16168 | 4/1999 |

* cited by examiner

Primary Examiner—M Budd
(74) Attorney, Agent, or Firm—Keating & Bennett, LLP

(57) ABSTRACT

A surface acoustic wave element includes multilayer electrodes having much higher electric power durability compared to conventional surface acoustic wave elements. The multilayer electrodes are prepared by forming, on a piezoelectric substrate, a Ti base electrode film that improves the orientation characteristics of the multilayer electrodes, an Al-type electrode film, an electrode film having a diffusive material that can easily diffuse into the grain boundary of the Al electrode film, and then an Al electrode film, in this order.

16 Claims, 3 Drawing Sheets

SURFACE ACOUSTIC WAVE ELEMENT

BACKGROUND OF THE INVENTION

1. Field of the Invention

The present invention relates to a surface acoustic wave element. More particularly, the present invention relates to a surface acoustic wave element including electrodes that have high electric power durability, and are suitable for use in antenna duplexers, and other electronic devices.

2. Description of the Related Art

Surface acoustic wave elements are usually prepared by forming a comb-like interdigital transducer electrodes (referred to as "IDT electrode", hereinafter) including an Al film on the surface of a substrate having piezoelectric characteristics. Such surface acoustic wave elements are widely used for resonators, inter-stage filters, duplexers, etc.

In recent years, development of miniaturized and much lighter mobile communication terminal devices such as portable telephones has advanced rapidly. Accordingly, components for use in such mobile communication terminal devices have been required to be miniaturized. In relation to this, demands for miniaturized surface acoustic wave elements for use in resonators, inter-stage filters, duplexers, etc. have been increasing rapidly, since they can contribute to miniaturization of RF devices (high frequency devices). More particularly, high electric power durability is required for antenna duplexers located at the front end of RF devices.

Furthermore, as the mobile communication devices are being used in higher frequency ranges, it is necessary to make surface acoustic wave devices (SAW devices) using surface acoustic wave elements operate in higher frequency ranges of several hundred MHz to several GHz, and with high output.

In order to make the surface acoustic wave devices operate in higher frequency ranges, it is necessary to realize finer pattern widths for IDT electrodes. For example, filters with a central frequency in a 2 GHz range require finer electrode lines with a line width that is reduced down to about 0.5 IIm. In order to make the surface acoustic wave devices operate with a high output, it is necessary to form electrodes that are not damaged due to generation of hillocks, voids, and other problems, even when signals at higher voltage levels are applied to the surface acoustic wave elements.

However, when signals at higher voltage levels are applied to surface acoustic wave elements having such a fine line width, the surface acoustic waves exert a high stress on their IDT electrodes that are made of Al film, for example. When the stress exceeds the stress limit of the IDT electrodes (Al films), stress migration will occur, causing Al atoms as an electrode material to migrate through the crystal grain boundary, leading to generation of hillocks, voids, and other problems, and resulting in destruction of the IDT electrodes, increase of electric short circuit and insertion loss, and deterioration in properties including a lowered Q factor of resonators.

In order to solve these problems, Japanese Unexamined Patent Application Publication No. 7-122961 proposes a surface acoustic wave element having electrodes formed by laminating Al alloy films with at least Cu added thereto and Cu films alternately on a piezoelectric substrate. Japanese Unexamined Patent Application Publication No. 9-69748 proposes a SAW device, wherein Al films and films composed of an electroconductive material having an elastic modulus larger than that of the Al films are laminated alternately, and the number of the laminated films are not less than two, respectively. In both cases, it is believed that the films improve the electric power durability.

However, in recent years, the line width of electrodes for surface acoustic wave elements is becoming finer and finer, while even higher output is required. Thus, there are cases in which the above-described conventional multilayer electrodes cannot fully satisfy such requirements.

SUMMARY OF THE INVENTION

In order to overcome the problems described above and meet the ever-increasing demands of the electronics industry, preferred embodiments of the present invention provide a surface acoustic wave element having electrodes (multilayer electrodes) with greatly improved electric power durability, compared to the conventional surface acoustic wave elements.

According to a preferred embodiment of the present invention, a surface acoustic wave element includes a piezoelectric substrate and an electrode disposed on the piezoelectric substrate, wherein the electrode is a multilayer electrode having three or more layers, the electrode including (a) a base electrode film disposed on the piezoelectric substrate; (b) an Al-type electrode film including Al as a main component that is disposed on the base electrode film; and (c) an electrode film having a diffusive material as a main component that is disposed on the Al-type electrode film, the diffusive material being able to easily diffuse into the grain boundary of the Al-type electrode film, and wherein the base electrode film includes a material that is capable of improving the orientation characteristics of the multilayer electrode.

By making the electrode having three or more layers including (a) a base electrode film disposed on the piezoelectric substrate, (b) an Al-type electrode film including Al as a main component that is disposed on the base electrode film, and (c) an electrode film having a diffusive material as a main component that is disposed on the Al-type electrode film, the diffusive material being able to easily diffuse into the grain boundary of the Al-type electrode film, it is possible to orientate the electrode (multilayer electrode) along one axis, or even along three axes to achieve higher degree of orientation, resulting in greatly improved electric power durability. It is possible to further improve the electric power durability by virtue of the diffusion of the diffusive material in the electrode film disposed on the Al-type electrode film into the grain boundary of the Al-type electrode films.

Furthermore, a surface acoustic wave element according to another preferred embodiment of the present invention is arranged such that the above-described base electrode film includes, as a main component, Ti that is capable of improving the orientation characteristics of the above-described multilayer electrode, and the above-described Al-type electrode is orientated along three axes.

When the base electrode film includes, as a main component, Ti that is capable of improving the orientation characteristics of the multilayer electrode, and the Al-type electrode is orientated along three axes, it is possible to further improve the electric power durability. This is another advantage of preferred embodiments of the present invention.

Furthermore, a surface acoustic wave element according to still another preferred embodiment of the present invention is characterized in that the electrode film having a diffusive material includes, as a main component, at least one metal selected from the group consisting of Cu, Ag, Au, Ni, and Mg that can easily diffuse into the grain boundary of the above-described Al-type electrode film.

By forming, as an electrode film disposed on the Al-type electrode film, an electrode film including, as a main component, at least one metal selected from the group consisting of Cu, Ag, Au, Ni, and Mg that can easily diffuse into the grain boundary of the Al-type electrode film, it is possible to achieve further improvement of the electric power durability.

Furthermore, a surface acoustic wave element according to still another preferred embodiment of the present invention is characterized in that each film layer constituting the above-described multilayer electrode has a film thickness of not more than approximately 50 nm.

By making the film thickness of each film layer constituting the multilayer electrode not more than approximately 50 nm, it is possible to prevent grain growth in the direction of the plane of the crystal grains and to prevent the diffusive material from diffusing into the grain boundary non-uniformly, resulting in further improvement in the electric power durability of the multilayer electrode.

Other features, elements, characteristics and advantages of the present invention will become more apparent from the following detailed description when taken in conjunction with the accompanying drawings.

DETAILED DESCRIPTION OF PREFERRED EMBODIMENTS

Figure 1:
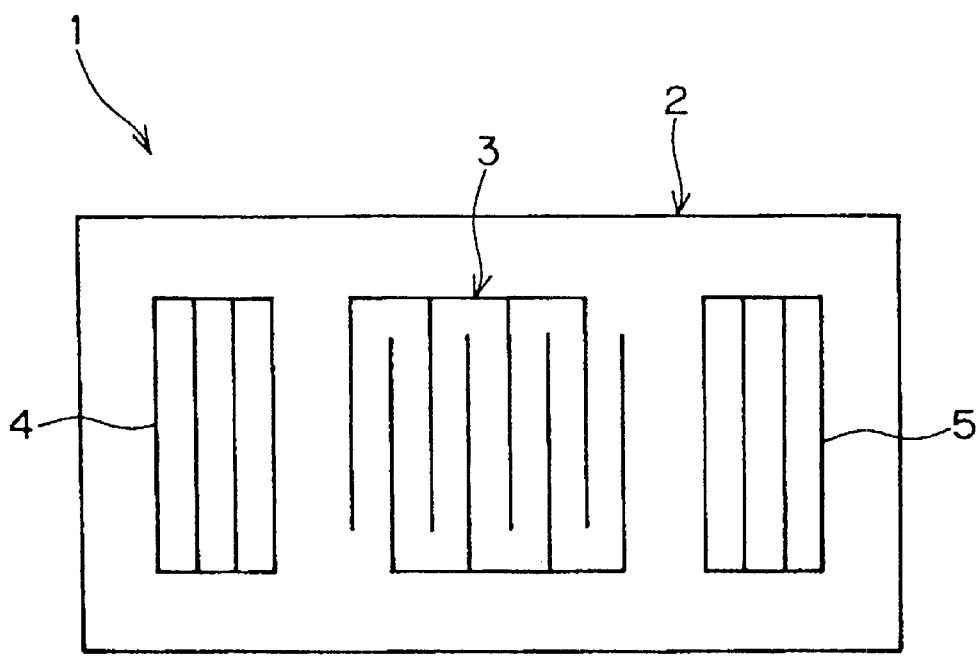
FIG. 1 is a plan view schematically showing a surface acoustic wave element according to a preferred embodiment of the present invention.

The following preferred embodiments will explain the characteristics of the present invention more in detail. FIG. 1 is a plan view schematically showing a surface acoustic wave element according to a preferred embodiment of the present invention, and FIG. 2 is a cross-sectional view showing principal elements of the surface acoustic wave element according to this preferred embodiment.

The surface acoustic wave element 1 according to this preferred embodiment is formed by providing electrodes (IDT electrodes 3 and reflector electrodes 4 and 5) on the surface of a piezoelectric substrate 2 made of $LiNbO_3$, as shown in FIG. 1.

Figure 2:
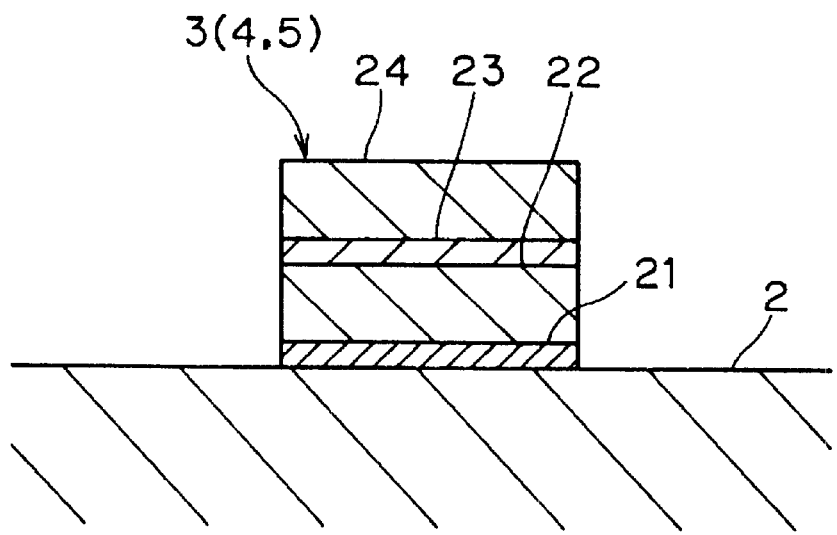
FIG. 2 is a cross-sectional view showing principal elements of the surface acoustic wave element according to the preferred embodiment shown in FIG. 1.

Furthermore, the electrodes (the IDT electrodes 3 and the reflector electrodes 4 and 5) are preferably multilayer (four-layer) electrodes each including, as shown in FIG. 2: (a) a Ti base electrode film 21 disposed on the piezoelectric substrate 2; (b) an Al electrode film 22 (an Al-type electrode film) disposed on the base electrode film 21; (c) a Cu electrode film 23 (an electrode film having a diffusive material) disposed on the Al electrode film 22, and including Cu that can easily diffuse into the grain boundary of the Al electrode film 22; and (d) an Al electrode film 24 disposed on the Cu electrode film 23.

Next, a method for manufacturing the surface acoustic wave element 1 including the electrodes having the above-described multilayer structure (the IDT electrodes 3 and the reflector electrodes 4 and 5) will be explained.

Figure 3:
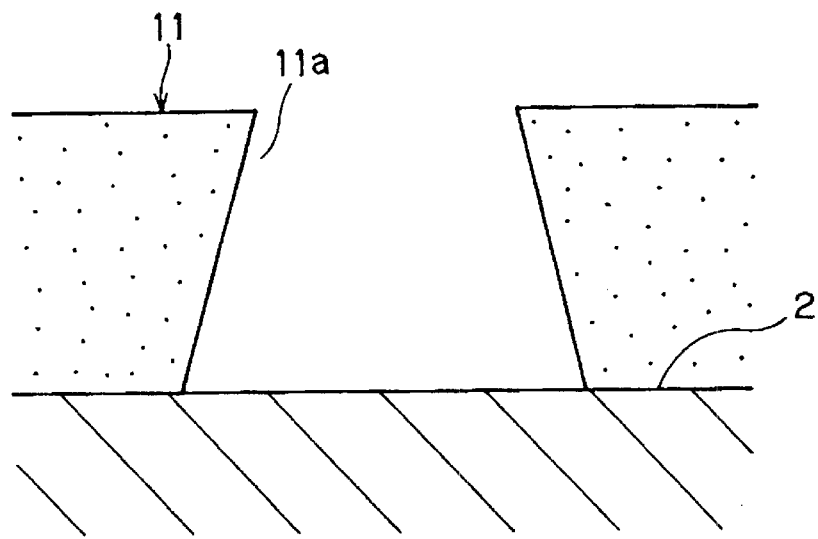
FIG. 3 is a view showing a state in which a resist pattern is formed on a piezoelectric substrate in a step for manufacturing the surface acoustic wave element according to a preferred embodiment the present invention.

First, a piezoelectric substrate 2 preferably made of a 64θ Y-X cut $LiNbO_3$ is prepared. A photoreactive resin is applied to the piezoelectric substrate 2 as a resist. Then, light exposure is carried out through a photomask having a shape required for the electrode patterns, followed by development of the resist using a development solution, resulting in a resist pattern 11 being formed on the piezoelectric substrate 2 as shown in FIG. 3. It is to be noted that the portion (vacant portion) 11a where the resist is removed to leave the resist pattern 11, has a cross-sectional shape of an inverted trapezoid.

Next, ion etching pretreatment is carried out to remove a layer having a thickness of several nanometers formed on the piezoelectric substrate 2 as a result of the modification of the surface of the substrate 2 during the previous processing.

Figure 4:
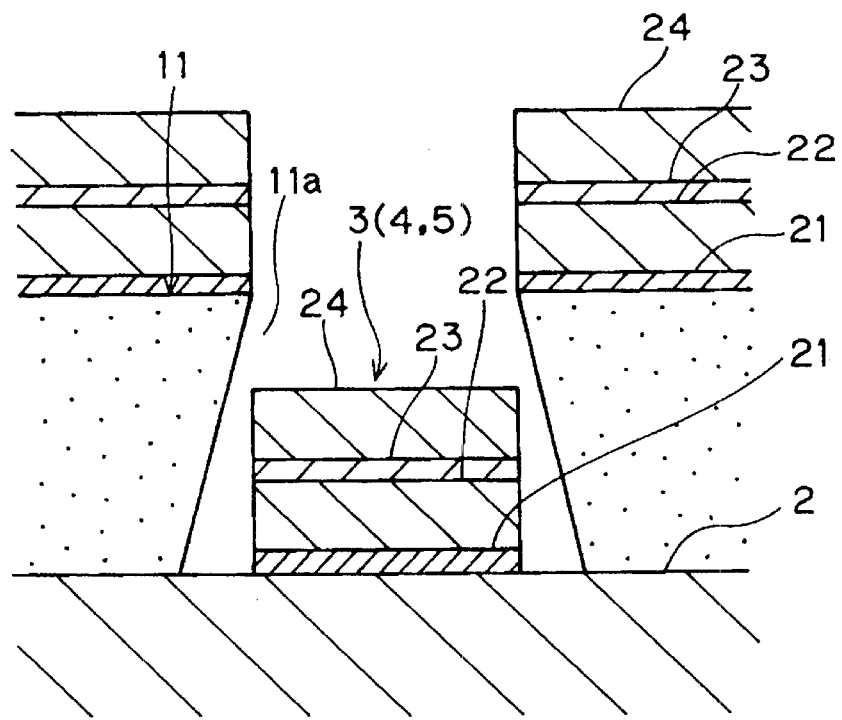
FIG. 4 is a view showing a state in which multilayer electrodes are formed on a piezoelectric substrate in a step for manufacturing the surface acoustic wave element according to a preferred embodiment of the present invention.

A Ti base electrode film 21 having a film thickness of about 10 nm is deposited over the resist pattern 11 by a vapor deposition method. Subsequently, an Al electrode film 22 having a film thickness of about 50 nm, a Cu electrode film 23 having a film thickness of about 10 nm, and an Al electrode film 24 having a film thickness of about 50 nm are deposited in this order to form multilayer electrodes as shown in FIG. 4.

Then, the resist pattern is immersed in a resist removing solution to dissolve the resist pattern 11 in the solution to lift it off the piezoelectric substrate 2. Accordingly, a surface acoustic wave element 1 is prepared that has, as shown in FIG. 2, multilayer electrodes (the IDT electrodes 3 and the reflector electrodes 4 and 5) formed by laminating the Ti base electrode film 21, the Al electrode film 22, the electrode film 23 (Cu electrode film) made of Cu that can easily diffuse into the grain boundary of the Al electrode film 22, and the Al electrode film 24, on the piezoelectric substrate 2, in this order.

In this preferred embodiment, since ion etching pretreatment is carried out in the above-described second step to remove a layer having a thickness of several nanometers formed on the substrate as a result of the modification of the surface of the substrate during the previous processing, and then the Ti base electrode film 21 having a thickness of about 10 nm is deposited over the resist pattern 11 by vapor deposition in the above-described step 3, it is possible to grow the (001) plane of the Ti electrode film 21 epitaxially on the Z plane of the $LiNbO_3$ substrate.

Furthermore, the Al electrode film 22, the Cu electrode film 23, and the Al electrode film 24 are deposited in this order on the Ti electrode film 21 thus formed. Accordingly, the Al electrode film 22 grows epitaxially.

Figure 5:
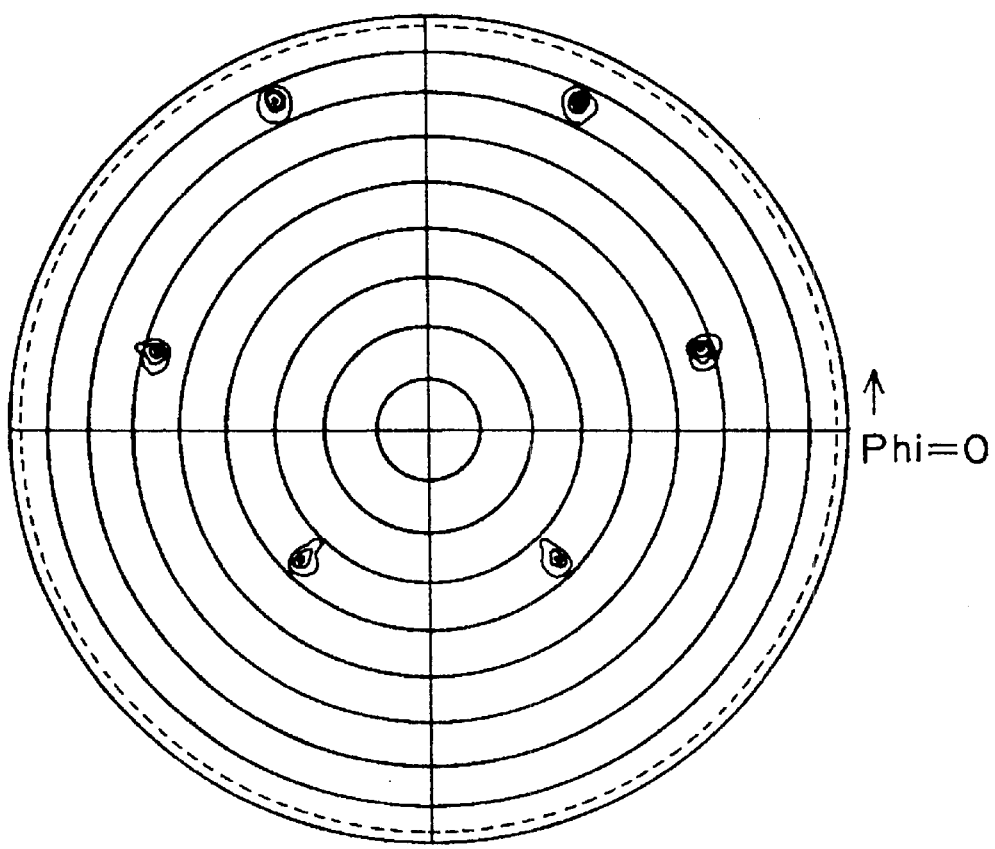
FIG. 5 is a diagram showing an X-ray diffraction (XRD) pattern of an electrode constituting a surface acoustic wave element according to a preferred embodiment of the present invention.

As a result of an investigation of the orientation characteristics of a multilayer electrode by XRD, it was confirmed that the Al electrode film 22 in the multilayer electrode was orientated along three axes as shown in FIG. 5.

Furthermore, electric power durability lifetime at approximately 0.8 W was investigated on the surface acoustic wave element samples obtained by the above-described preferred embodiment. The results are shown in Table 1.

TABLE 1

| Sample No. | 1 | 2 | 3 | 4 | 5 |
|---|---|---|---|---|---|
| Electrode structure | Al/Ti | Al/Cu/Al | Al/Ti/Al/Ti | Al/Cu/Al/Ti orientation along one axis | Al/Cu/Al/Ti orientation along three axes |
| Electric power durability lifetime (h) | 40 | 460 | 120 | 820 | 2,240 |

It is to be noted that the terms Al/Ti in Sample No. 1, Al/Cu/Al in Sample No. 2, Al/Ti/Al/Ti in Sample No. 3, and Al/Cu/Al/Ti in Sample Nos. 4 and 5 represent, respectively in Table 1, the metal configurations used for the electrode films in the order of lamination when viewed from the upper layer side to the bottom layer side, that is, to the piezoelectric substrate side.

The multilayer electrodes of Sample Nos. 1, 2, and 3 were not orientated. The multilayer electrode of Sample No. 4 had its Al electrode film on the Ti base electrode film orientated along one axis. The multilayer electrode of Sample No. 5 had its Al electrode film on the Ti base electrode film orientated along three axes.

From Table 1, it is understood that the lifetimes of Sample No. 1 Al/Ti electrode, Sample No. 2 Al/Cu/Al electrode, and Sample No. 3 Al/Ti/Al/Ti electrode were 40 hrs, 460 hrs, and 120 hrs, respectively, proving that the lifetime of un-orientated electrodes was short. To compare, the lifetime of Sample No. 4 Al/Cu/Al/Ti electrode that was orientated along one axis, was 820 hrs, proving that the electric power durability was improved greatly. Furthermore, the lifetime of Sample No. 5 Al/Cu/Al/Ti electrode that was orientated along three axes was 2,240 hrs, proving that even better electric power durability was realized.

Accordingly, when a Ti electrode film was used as a base electrode film, it was possible to effect high electric power durability by virtue of orientation along one axis as shown in the case of Sample No. 4. Furthermore, when orientation along three axes was realized as shown in the case of Sample No. 5, a lifetime of 2,240 hrs, that was about 2.7 times as high as that of Sample No. 4 with orientation along one axis, was effected, even if the same Al/Cu/Al/Ti-structure electrode as in the case of Sample No. 4 was used.

The lifetime of multilayer electrodes was investigated by varying the film thickness of each electrode film constituting the multilayer electrodes, in order to find out the relationship between the film thickness of each electrode film constituting the multilayer electrodes and the electric power durability of the multilayer electrodes. The results are shown in Table 2.

TABLE 2

| Sample No. | 6 | 7 | 8 |
|---|---|---|---|
| Structure of electrodes | | Al/Cu/Al/Ti | |
| Film thickness (nm) | 80/10/80/10 (orientation along one axis) | 50/10/50/10 (orientation along three axes) | 30/20/30/20 (orientation along three axes) |
| Electric power durability lifetime (h) | 820 | 2,240 | 2,880 |

Table 2 indicates that Sample No. 7 multilayer electrode having a structure of about 50 nm-thick Al/10 nm-thick Cu/50 nm-thick Al/10 nm-thick Ti and Sample No. 8 multilayer electrode having a structure of about 30 nm-thick Al/20 nm-thick Cu/30 nm-thick Al/20 nm-thick Ti, respectively formed on an LiNbO$_3$ substrate had longer lifetimes and therefore better electric power durability than Sample No. 6 multilayer electrode having a film structure of about 80 nm-thick Al/10 nm-thick Cu/80 nm-thick Al/10 nm-thick Ti formed on an LiTaO$_3$ substrate.

From these results, it is understood that electric power durability is greatly improved by limiting the film thickness of each electrode film to not more than approximately 50 nm. It is to be noted that data other than those shown in Table 2 also indicated that excellent electric power durability was realized when the film thickness of each electrode film was not more than approximately 50 nm.

In the above-described preferred embodiments, multilayer electrodes having a film structure of Al/Cu/Al/Ti laminated in this order when viewed from the upper layer side to the piezoelectric substrate side, were taken as examples. However, alloy materials can also be used for forming each electrode film. For example, it is possible to use, as a base electrode film material, a Ti alloy film in which one or more metals are added to Ti, to form an Al alloy film thereon in which one or more metals are added to Al, to form a Cu alloy film thereon in which one or more metals are added to Cu, and then to form, as the uppermost layer, an Al alloy film in which one or more metals are added to Al.

Furthermore, the structure of the multilayer electrodes is not limited to the four-layer structure of Al/Cu/Al/Ti. For example, a three-layer structure of Cu (or Cu alloy)/Al (or Al alloy)/Ti (or Ti alloy) can also be used. It is also possible to use a five-layer structure or a structure having more than five layers.

In the above-described preferred embodiments, a Cu electrode film was preferably used as an electrode film disposed on the Al-type electrode film, and having, as a main component, a material that can easily diffuse into the grain boundary of the Al electrode film. It is, however, possible to use an Ag electrode film, an Au electrode film, an Ni electrode film, an Mg electrode film, or other suitable film, as an electrode film having a diffusive material in place of the Cu electrode film.

Furthermore, in the above-described preferred embodiments, a 640 Y-X cut LiNbO$_3$ was used as a piezoelectric substrate. However, the piezoelectric substrate is not the only possible material for the present invention, and various piezoelectric single crystal substrates such as a quartz single crystal substrate or other suitable substrate can be used.

Furthermore, the present invention is not limited by the above-described preferred embodiments in other points, and various changes and modifications may be possible within the spirit and scope of the present invention relating to the pattern of the multilayer electrodes including electrode films, shapes of the piezoelectric substrates, and other features.

As described above, a surface acoustic wave element according to various preferred embodiments of the present invention has multilayer electrodes having three or more layers, each electrode obtained by forming (a) a base electrode film disposed on a piezoelectric substrate, (b) an Al-type electrode film including Al as a main component that is disposed on the base electrode film, and (c) an electrode film disposed on the Al-type electrode film, and including, as a main component, a material that can easily diffuse into the grain boundary of the Al-type electrode film.

Accordingly, it is possible to make the multilayer electrodes orientated along one axis. It is even possible to realize higher orientation by orientating the electrodes along three axes. The electric power durability is thus greatly improved. Furthermore, since the diffusive material diffuses from the electrode film disposed on the Al-type electrode film into the grain boundary of the Al-type electrode film, it is possible to further improve the electric power durability.

Furthermore, when an electrode film including, as a main component, Ti that can improve the orientation characteristics is arranged as a base electrode film and the Al-type electrode is orientated along three axes, as in a surface acoustic wave element according to another preferred embodiment of the present invention, it is possible to further improve the electric power durability. This is another advantage of the present invention.

Furthermore, when at least one metal selected from the group consisting of Cu, Ag, Au, Ni, and Mg that can easily diffuse into the grain boundary of the Al-type electrode film, is used as a main component for the electrode film having a diffusive material, as in a surface acoustic wave element according to still another preferred embodiment of the present invention, it is certainly possible to further improve the electric power durability.

Furthermore, when the film thickness of each electrode film constituting a multilayer electrode is limited to not more than approximately 50 nm as in a surface acoustic wave element according to still another preferred embodiment of the present invention, it is possible to prevent grain growth in the direction of the plane of the crystal grains and prevent the diffusive material from diffusing into the grain boundary non-uniformly, resulting in an electrode with still better electric power durability.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave element comprising:
   a piezoelectric substrate; and
   art electrode disposed on the piezoelectric substrate; wherein
   said electrode is a multilayer electrode having at least three layers including:
     a base electrode film disposed on said piezoelectric substrate;
     a first electrode film including Al as a main component that is disposed on said base electrode film; and
     a second electrode film having, as a main component, a diffusive material that is disposed on said first electrode film, the material being capable of easily diffusing into the grain boundary of said first electrode film, and wherein
       said base electrode film includes a material that is capable of improving the orientation characteristics of said multilayer electrode.

2. A surface acoustic wave element according to claim 1, wherein said base electrode film includes, as a main component, Ti that is capable of improving the orientation characteristics of said multilayer electrode, and said first electrode film is orientated along three axes.

3. A surface acoustic wave element according to claim 1, wherein said second electrode film having a diffusive material includes, as a main component, at least one metal selected from the group consisting of Cu, Ag, Au, Ni, and Mg that can easily diffuse into said grain boundary of the first electrode film.

4. A surface acoustic wave element according to claim 1, wherein each layer of the films constituting said multilayer electrode has a film thickness of not more than about 50 nm.

5. A surface acoustic wave element according to claim 1, further comprising reflector electrodes disposed on the piezoelectric substrate.

6. A surface acoustic wave element according to claim 1, wherein the piezoelectric substrate is made of one of $LiNbO_3$ and quartz single crystal.

7. A surface acoustic wave element according to claim 1, wherein said multilayer electrode includes a third electrode film disposed on the second electrode film and including Al as a main component.

8. A surface acoustic wave element according to claim 1, wherein said multilayer electrode includes at least four layers.

9. A surface acoustic wave element according to claim 1, wherein said base electrode film has a film thickness of about 10 nm.

10. A surface acoustic wave element according to claim 1, wherein said first electrode film has a film thickness of about 50 nm.

11. A surface acoustic wave element according to claim 1, wherein said second electrode film has a film thickness of about 10 nm.

12. A surface acoustic wave element according to claim 7, wherein said third electrode film has a film thickness of about 50 nm.

13. A surface acoustic wave element according to claim 1, wherein said piezoelectric substrate is a 64θ Y-X cut $LiNbO_3$ substrate.

14. A surface acoustic wave element according to claim 1, wherein said multilayer electrode includes at least four layers including a first layer made of Ti, a second layer made of Al disposed on the first layer, a third layer made of Cu disposed on the second layer, and a fourth layer made of Al disposed on the third layer.

15. A surface acoustic wave element according to claim 1, wherein said multilayer electrode includes at least four layers including a first layer made of a Ti alloy, a second layer made of an Al alloy disposed on the first layer, a third layer made of a Cu alloy disposed on the second layer, and a fourth layer made of an Al alloy disposed on the third layer.

16. A surface acoustic wave element according to claim 1, wherein said multilayer layer electrode has a three layer structure including a first layer made of one of Ti and a Ti alloy, a second layer made of one of Al and an Al alloy disposed on the first layer, and a third layer made of one of Cu and a Cu alloy disposed on the second layer.

* * * * *